US012670960B2

(12) United States Patent
Lin et al.

(10) Patent No.: US 12,670,960 B2
(45) Date of Patent: Jun. 30, 2026

(54) MEMORY DEVICE FOR APPLYING VOLTAGES TO WORD LINES DURING ERASE OPERATIONS AND OPERATING METHOD FOR MEMORY DEVICE

(71) Applicant: MACRONIX International Co., Ltd., Hsinchu (TW)

(72) Inventors: Tao-Yuan Lin, Taipei City (TW); I-Chen Yang, Miaoli County (TW); Yao-Wen Chang, Hsinchu County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 146 days.

(21) Appl. No.: 18/761,315

(22) Filed: Jul. 2, 2024

(65) Prior Publication Data

US 2026/0011375 A1 Jan. 8, 2026

(51) Int. Cl.
*G11C 16/14* (2006.01)
*G11C 16/04* (2006.01)

(52) U.S. Cl.
CPC .......... *G11C 16/14* (2013.01); *G11C 16/0483* (2013.01)

(58) Field of Classification Search
CPC .......................... G11C 16/14; G11C 16/0483
See application file for complete search history.

(56) References Cited

U.S. PATENT DOCUMENTS

| | | | |
|---|---|---|---|
| 2012/0051136 A1 | 3/2012 | Kang et al. | |
| 2015/0003170 A1* | 1/2015 | Kim | G11C 16/0483 365/185.29 |
| 2020/0119045 A1* | 4/2020 | Nam | H10B 41/35 |
| 2020/0411105 A1* | 12/2020 | Lee | G11C 16/14 |
| 2022/0392541 A1* | 12/2022 | Lee | G11C 16/08 |
| 2024/0145017 A1 | 5/2024 | Ham et al. | |
| 2024/0170072 A1 | 5/2024 | Lim et al. | |

FOREIGN PATENT DOCUMENTS

| | | |
|---|---|---|
| TW | I518850 | 1/2016 |
| TW | I806427 | 6/2023 |
| TW | I822170 | 11/2023 |

OTHER PUBLICATIONS

"Office Action of Taiwan Counterpart Application", issued on May 20, 2025, p. 1-p. 3.

* cited by examiner

*Primary Examiner* — Jerome Leboeuf
(74) *Attorney, Agent, or Firm* — J.C. PATENTS

(57) ABSTRACT

A memory device is a three-dimensional NAND flash memory device with high-performance and high-capacity. The memory device includes a common source line, at least one bit line and at least one memory string. During an erasing operation, an erasing voltage is applied to at least one of the common source line and the at least one bit line. In a first period of the erasing operation, a voltage value of the erasing voltage is raised, and a voltage value of a word line voltage is a first voltage value. In a second period after the first period of the erasing operation, the voltage value of the erasing voltage is a target voltage value, and the voltage value of the word line voltage is raised from the first voltage value to a second voltage value.

19 Claims, 6 Drawing Sheets

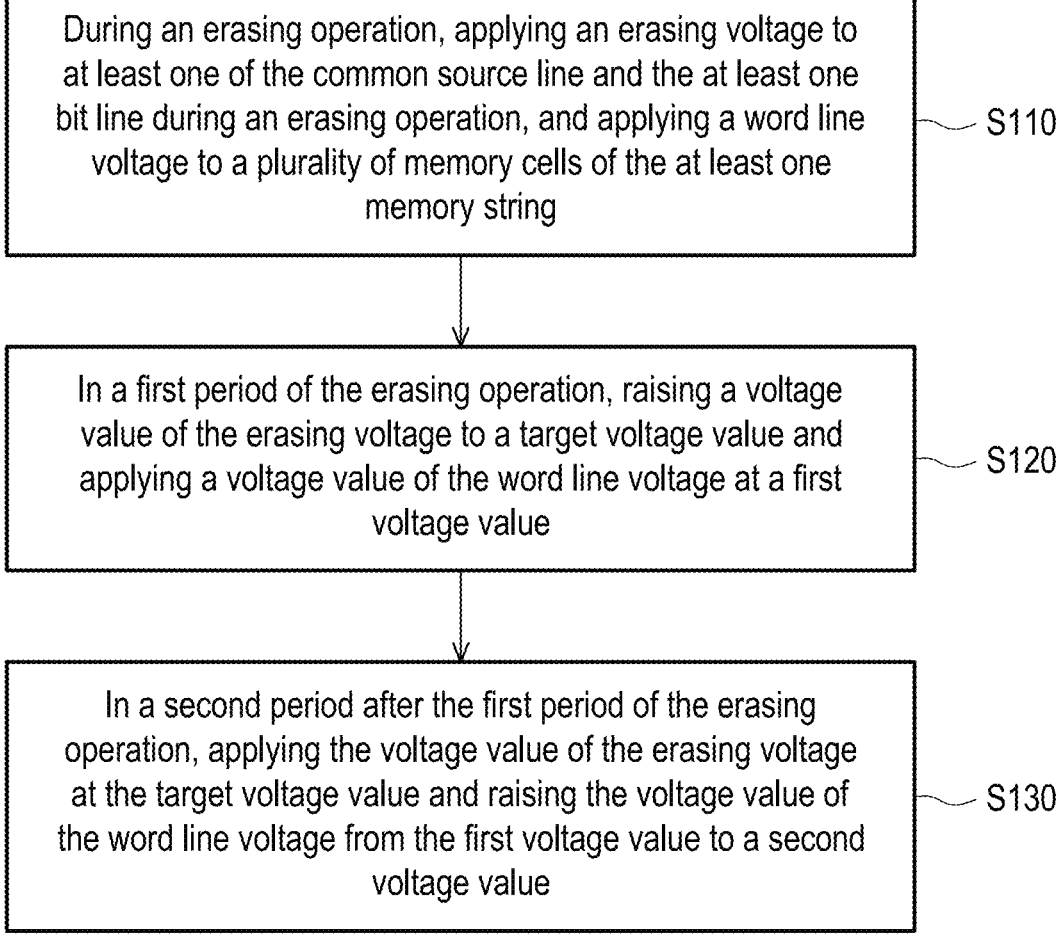

During an erasing operation, applying an erasing voltage to at least one of the common source line and the at least one bit line during an erasing operation, and applying a word line voltage to a plurality of memory cells of the at least one memory string ⎯⎯ S110

In a first period of the erasing operation, raising a voltage value of the erasing voltage to a target voltage value and applying a voltage value of the word line voltage at a first voltage value ⎯⎯ S120

In a second period after the first period of the erasing operation, applying the voltage value of the erasing voltage at the target voltage value and raising the voltage value of the word line voltage from the first voltage value to a second voltage value ⎯⎯ S130

MEMORY DEVICE FOR APPLYING VOLTAGES TO WORD LINES DURING ERASE OPERATIONS AND OPERATING METHOD FOR MEMORY DEVICE

BACKGROUND

Technical Field

The disclosure generally relates to a memory device and an operating method for the memory device, and more particularly to a memory device and an operating method for decreasing an erase bias loss of an erasing operation performing on at least one memory string of the memory device.

Description of Related Art

Generally, a memory device performs an erasing operation on memory strings of the memory device. If the memory device is a 3D NAND flash memory device, memory device may perform a gate-induced drain leakage (GIDL) assisted erasing operation on the memory strings. A plurality of data stored in the memory strings are erased based on channel potentials in channels in the memory strings. The channel potentials are generated by an external erasing voltage.

However, during the GIDL assisted erasing operation, an erase bias loss between external erasing voltage and the channel potentials is generated with at least one factor. The at least one factor includes at least one of reducing lateral electric field, a bit line junction and a common source line junction. In other words, a voltage value of the channel potentials would be always lower than a voltage value of the external erasing voltage. Thus, a reliability of the GIDL assisted erasing operation would be affected by the at least one factor.

SUMMARY

The disclosure provides a memory device and an operating method. The memory device and the operating method can decrease an erase bias loss of an erasing operation when performing at least one memory string of the memory device.

In an embodiment of the disclosure, the memory device includes a common source line, at least one bit line and at least one memory string. The at least one memory string is coupled to the common source line and the at least one bit line respectively. During an erasing operation, an erasing voltage is applied to at least one of the common source line and the at least one bit line and a word line voltage is applied to a plurality of memory cells of the at least one memory string. In a first period of the erasing operation, a voltage value of the erasing voltage is raised to a target voltage value, and a voltage value of the word line voltage is a first voltage value. In a second period after the first period of the erasing operation, the voltage value of the erasing voltage is the target voltage value, and the voltage value of the word line voltage is raised from the first voltage value to a second voltage value.

In an embodiment of the disclosure, the operating method is applicable to operate the memory device. The memory device includes a common source line, at least one bit line and at least one memory string coupled to the common source line and the at least one bit line respectively. The operating method includes: during an erasing operation, applying an erasing voltage to at least one of the common source line and the at least one bit line during an erasing operation, and applying a word line voltage to a plurality of memory cells of the at least one memory string; in a first period of the erasing operation, raising a voltage value of the erasing voltage to a target voltage value and applying a voltage value of the word line voltage at a first voltage value, and in a second period after the first period of the erasing operation, applying the voltage value of the erasing voltage at the target voltage value and raising the voltage value of the word line voltage from the first voltage value to a second voltage value.

Based on the above, in the first period of the erasing operation, the voltage value of the erasing voltage is raised, and the voltage value of the word line voltage is the first voltage value. In the second period after the first period of the erasing operation, the voltage value of the erasing voltage is the target voltage value, and the voltage value of the word line voltage is raised from the first voltage value to a second voltage value. It should be noted, in the second period, the raised word line voltage raises a channel potential in a channel in the at least one memory string. Therefore, the channel potential could be compensated in the second period. In this way, an erase biases loss between the erasing voltage and the channel potential could be decreased. Thus, the disclosure provides the stable and enhanced GIDL assisted erasing operation.

To make the aforementioned more comprehensible, several embodiments accompanied with drawings are described in detail as follows.

BRIEF DESCRIPTION OF THE DRAWINGS

FIG. 6 illustrates a flow chart of an operating method according to an embodiment of the disclosure.

DESCRIPTION OF THE EMBODIMENTS

A disclosure may be understood by reference to the following detailed description, taken in conjunction with the drawings as described below. It is noted that, for purposes of illustrative clarity and being easily understood by the readers, various drawings of this disclosure show a portion of an electronic device, and certain elements in various drawings may not be drawn to scale. In addition, the number and dimension of each device shown in drawings are only illustrative and are not intended to limit the scope of a disclosure.

Figure 1:
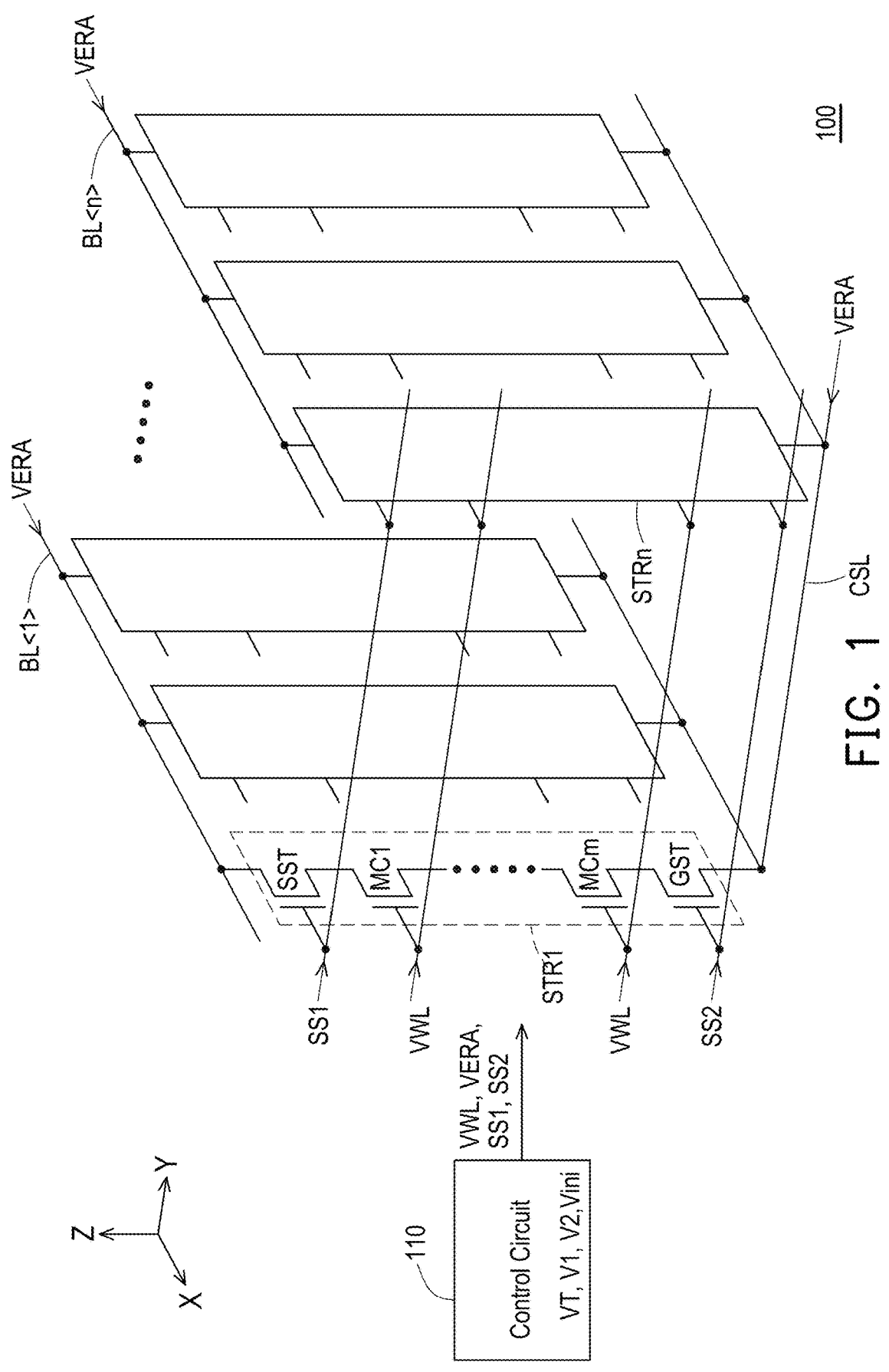
FIG. 1 illustrates a schematic diagram of a memory device according to an embodiment of the disclosure.

Please refer to FIG. 1, FIG. 1 illustrates a schematic diagram of a memory device according to an embodiment of the disclosure. The memory device 100 may be a 3D NAND flash memory device. In the embodiment, the memory device 100 includes a common source line CSL, bit lines BL<1> to BL<n> and memory string STR1 to STRn. The memory strings STR1 to STRn is coupled to the common source line CSL and the bit lines BL<1> to BL<n> respectively. For example, the memory string STR1 is coupled between common source line CSL and the bit line BL<1>. The memory string STRn is coupled between common source line CSL and the bit line BL<n>.

Taking the memory string STR1 as an example, the memory string STR1 includes memory cells MC1 to MCm. The memory cells MC1 to MCm are connected in series. A string select transistor SST and a ground select transistor GST are connected to memory cells MC1 and MCm respectively.

In the embodiment, during an erasing operation, an erasing voltage VERA is applied to at least one of the common source line CSL and the bit lines BL<1> to BL<n>. During an erasing operation, a word line voltage VWL is applied to memory cells of the memory strings STR1 to STRn. In the embodiment, the erasing operation is a block erasing operation. The erasing operation is a gate-induced drain leakage (GIDL) assisted erasing operation.

In the embodiment, the word line voltage VWL is applied to word lines connected to the memory strings STR1 to STRn. Taking the memory string STR1 as an example, the word line voltage VWL is applied to word lines connected to the memory cells MC1 to MCm in the memory string STR1.

In the embodiment, during the erasing operation, an erasing voltage VERA is applied to the common source line CSL and the bit lines BL<1> to BL<n>, but the disclosure is not limited thereto. In some embodiments, during the erasing operation, erasing voltage VERA is applied to the common source line CSL. In some embodiments, during the erasing operation, erasing voltage VERA is applied to the bit lines BL<1> to BL<n>.

Figure 2:
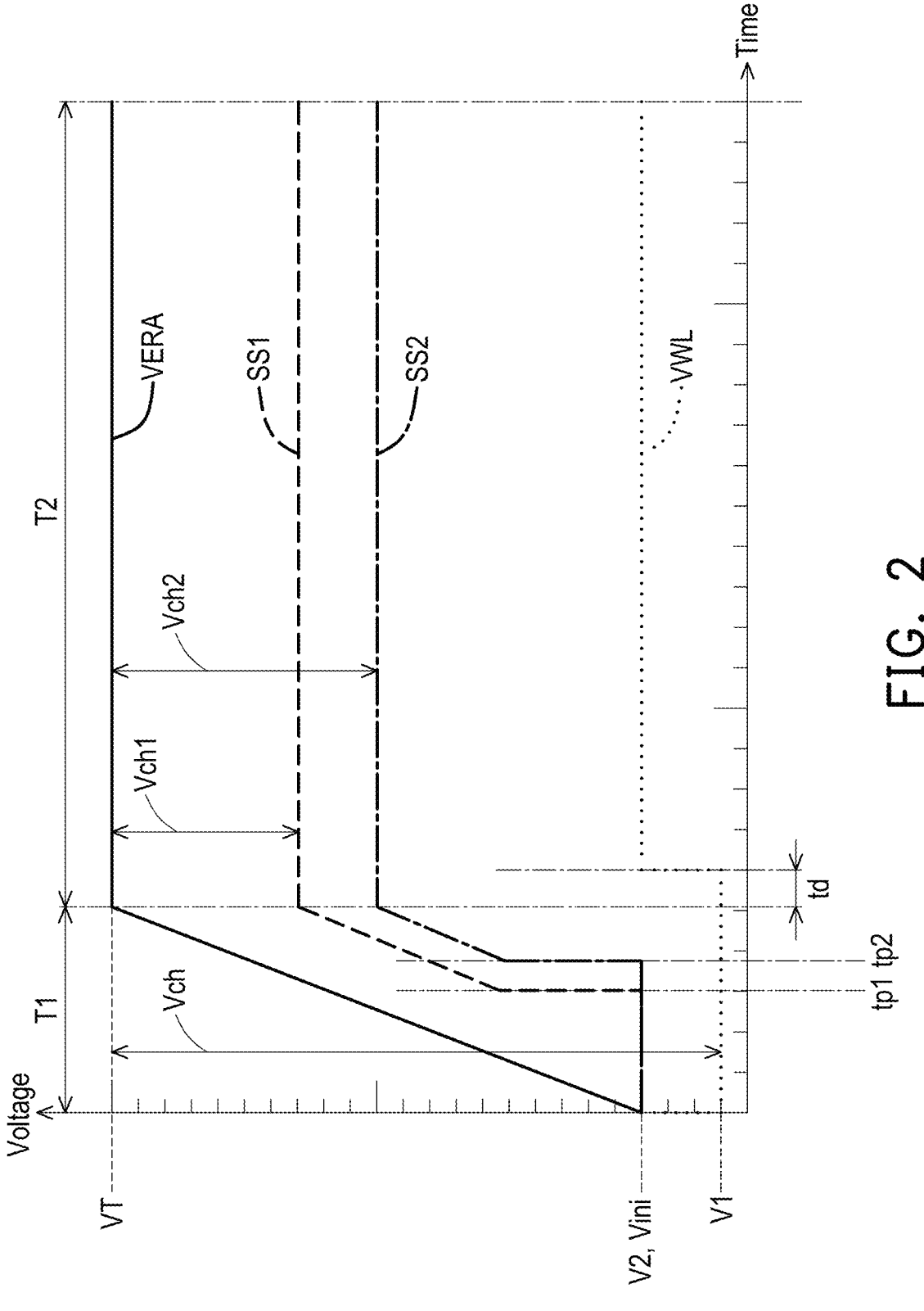
FIG. 2 illustrates a waveform diagram according to an embodiment of the disclosure.
Figure 3:
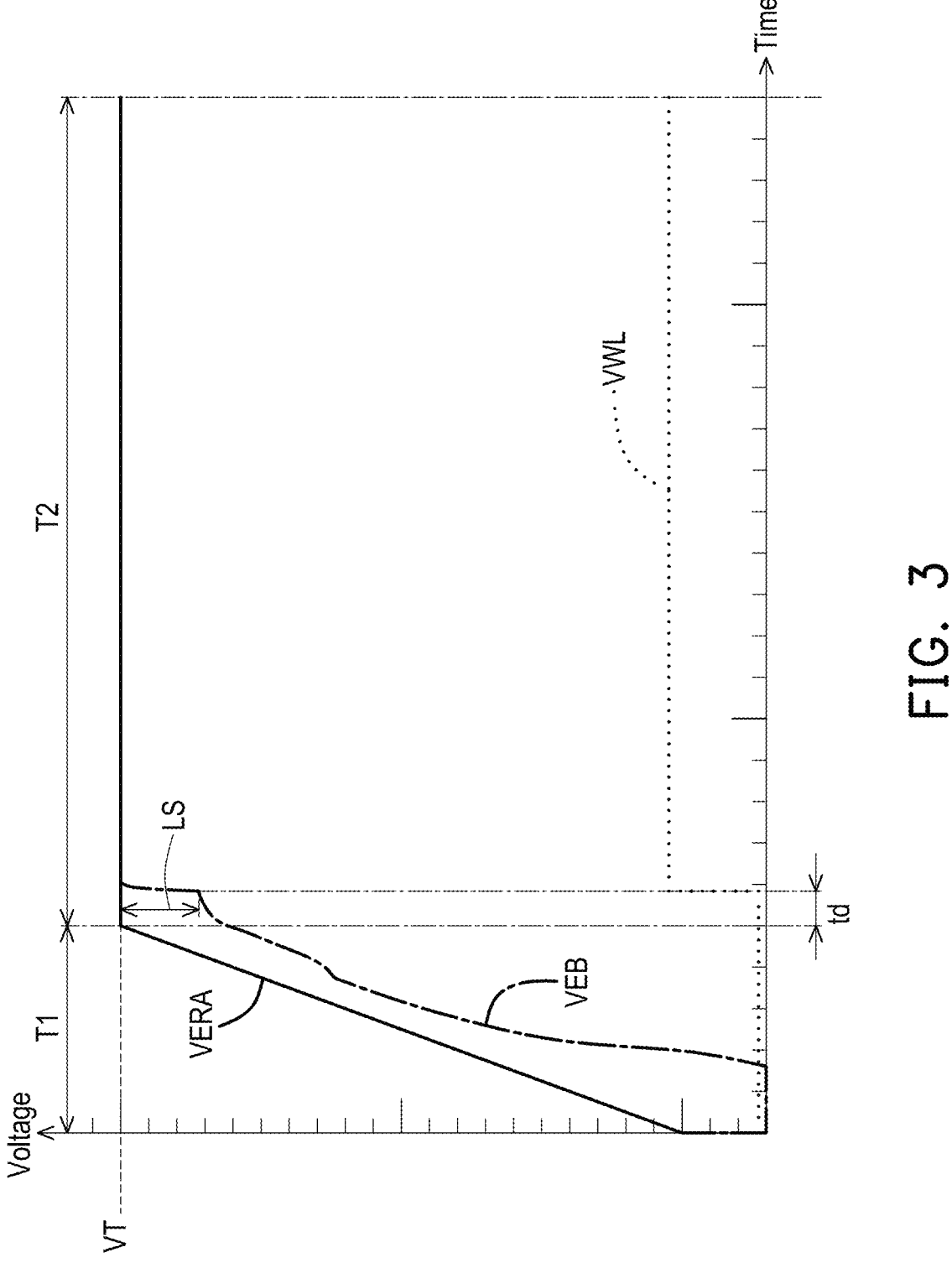
FIG. 3 illustrates a waveform diagram of an erasing voltage, a channel potential and a word line voltage according to an embodiment of the disclosure.

Please refer to FIG. 1, FIG. 2 and FIG. 3, FIG. 2 illustrates a waveform diagram according to an embodiment of the disclosure. FIG. 3 illustrates a waveform diagram of an erasing voltage, a channel potential and a word line voltage according to an embodiment of the disclosure. In the embodiment, in a first period T1 of the erasing operation, a voltage value of the erasing voltage VERA is raised to a target voltage value VT. In the first period T1, the voltage value of the word line voltage VWL is a first voltage value V1. For example, in the first period T1, the voltage value of the erasing voltage VERA is ramped gradually from an initial voltage value Vini to the target voltage value VT. At a starting time point of the first period T1, the voltage value of the word line voltage VWL is fallen from the initial voltage value Vini to the first voltage value V1, but the disclosure is not limited thereto. When the voltage value of the erasing voltage VERA reaches to the target voltage value VT, the first period T1 finishes, and a second period T2 begins.

In the second period T2 after the first period T1 of the erasing operation, the voltage value of the erasing voltage VERA is the target voltage value VT, and the voltage value of the word line voltage VWL is raised from the first voltage value V1 to a second voltage value V2.

During the erasing operation, the channel potential VEB is generated in each of channel structures of the memory strings STR1 to STRn. For example, each of the channel structures may be channel pillar in circuit under array (CUA) structure, but the disclosure is not limited thereto. In the first period T1, the channel potential VEB in each of the channel structures rises roughly as the erasing voltage VERA rises. After the voltage value of the erasing voltage VERA reaches to the target voltage value VT, an erase biases loss LS between the erasing voltage VERA and the channel potential VEB is generated. The erase biases loss LS may be generated based on at least one of reducing lateral electric field naturally, a bit line junction and a common source line junction.

In the embodiment, a difference voltage Vch between the target voltage value VT and the first voltage value V1 may be decided based on difference design or process of the memory strings STR1 to STRn. The erase biases loss LS is changed based on the design or the process. For example, in order to decrease the erase biases loss LS, the difference voltage Vch is in a range larger than 20 and less than 26 volts. A difference voltage of the first voltage value V1 minus the second voltage value V2 is designed to be in a range from zero to −6 volts. The initial voltage value Vini and the second voltage value V2 are 0 volt. The target voltage value VT is 20 volts. The first voltage value V1 is in a range from zero to −6 volts. More precisely, the difference voltage of the first voltage value V1 minus the second voltage value V2 is designed to be in a range from −3 to −4 volts. Therefore, the first voltage value V1 is in a range from −3 to −4 volts. For example, if the memory string STR1 includes 200 memory cells (that is, "m"=200), the first voltage value V1 is −3 volts. For example, if the memory string STR1 includes 800 memory cells (that is, "m"=800), the first voltage value V1 is −4 volts.

It should be noted, in the second period T2, the voltage value of the word line voltage VWL is raised from the first voltage value V1 to a second voltage value V2. The word line voltage VWL can raise the channel potential VEB based on capacitive coupling effect. Therefore, the channel potential VEB could be compensated in the second period T2. In this way, the erase biases loss LS between the erasing voltage VERA and the channel potential VEB could be decreased. Thus, the memory device 100 provides the stable and enhanced GIDL assisted erasing operation.

In the embodiment, in the second period T2, the channel potential VEB is raised to be substantially equal to target voltage value VT. Therefore, the erase biases loss LS is substantially equal to 0 volt.

In the embodiment, in the second period T2, the channel potential VEB still rises slowly. Thus, when entering in the second period T2 of the erasing operation, the voltage value of the erasing voltage VERA is the target voltage value VT. The voltage value of the word line voltage VWL is raised from the first voltage value V1 to the second voltage value V2 after a default time length td. Therefore, a rising voltage value (that is, "V2-V1") of the word line voltage VWL could be decreased. If the default time length td is increased, the rising voltage value is further decreased. However, an operating time length of the erasing operation would be longer. Therefore, the default time length td is a trade off parameter of the erasing operation. In the embodiment, the default time length td is larger than zero and less than 400 micro seconds.

In the embodiment, taking the memory string STR1 as an example, the memory string STR1 further includes a string select transistor SST and a ground select transistor GST. The string select transistor SST is coupled between a first edge memory cell (that is, the memory cell MC1) of the memory string STR1 and the bit line BL<1>. The ground select transistor GST is coupled between a second edge memory cell (that is, the memory cell MCm) of the memory string STR1 and the common source line CSL. In the embodiment, the string select transistor SST and the ground select transistor GST are controlled to participate in the erasing operation.

In the embodiment, during the erasing operation, a first selecting signal SS1 is applied to the string select transistor SST. A second selecting signal SS2 is applied to the ground select transistor GST. In the embodiment, the first selecting signal SS1 is applied to a gate electrode of the string select transistor SST. The second selecting signal SS2 is applied to a gate electrode of the ground select transistor GST.

In the first period T1 of the erasing operation, before a first time point tp1, a voltage value of the first selecting signal SS1 is equal to the initial voltage value Vini. The first selecting signal SS1 begins to be floated on the first time point tp1. The voltage value of the first selecting signal SS1 starts rising as the voltage value of the erasing voltage VERA rises on the first time point tp1. Therefore, after the first time point tp1, a difference voltage Vch1 between the voltage value of the erasing voltage VERA and the voltage value of the first selecting signal SS1 is fixed.

In the first period T1 of the erasing operation, before a second time point tp2, a voltage value of the second selecting signal SS2 is equal to the initial voltage value Vini. The second selecting signal SS2 begins to be floated on the second time point tp2. The voltage value of the second selecting signal SS2 starts rising as the voltage value of the erasing voltage VERA rises on the second time point tp2. Therefore, after the second time point tp2, a difference voltage Vch2 between the voltage value of the erasing voltage VERA and the voltage value of the second selecting signal SS2 is fixed.

It should be noted, in order to avoid electronic characteristics of the string select transistor SST and the ground select transistor GST being disturbed by the erasing voltage VERA during the erasing operation, the difference voltages Vch1 and Vch2 need to be limited to be lower than a threshold disturbed voltage value. The electronic characteristic of the string select transistor SST may be a threshold voltage value of the string select transistor SST. The electronic characteristic of the ground select transistor GST may be a threshold voltage value of the ground select transistor GST. Besides, the difference voltage Vch1 is associated with a voltage withstand capability of the string select transistor SST. The difference voltage Vch2 is associated with a voltage withstand capability of the ground select transistor GST. For example, if the voltage withstand capability of the ground select transistor GST is higher than the voltage withstand capability of the string select transistor SST, the second time point tp2 is later than the first time point tp1. Therefore, in the second period T2 of the erasing operation, the voltage value of the first selecting signal SS1 is higher than the voltage value of the second selecting signal SS2. For example, in the second period T2, the target voltage value VT is 20 volts. The voltage value of the first selecting signal SS1 is 13 volts. The voltage value of the second selecting signal SS2 is 10 volts. Therefore, the difference voltage Vch1 is 7 volts. The difference voltage Vch2 is 10 volts.

In some embodiment, during the erasing operation, the erasing voltage VERA is only applied to the bit lines BL<1> to BL<n>. Thus, the first selecting signal SS1 is applied based on the waveform in FIG. 2. The second selecting signal SS2 is equal to the erasing voltage VERA.

In some embodiment, during the erasing operation, the erasing voltage VERA is only applied to the common source line CSL. Thus, the second selecting signal SS2 is applied based on the waveform in FIG. 2. The first selecting signal SS1 is equal to the erasing voltage VERA.

In the embodiment, the common source line CSL extends along a direction Y. The bit lines BL<1> to BL<n> extend along a direction X and arrange along the direction Y. Each of the memory strings STR1 to STRn extends along a direction Z. Taking the memory string STR1 as an example, the memory cells MC1 to MCm of the memory string STR1 arrange along the direction Z. The directions X, Y and Z are different from each other.

In the embodiment, the memory device 100 further includes a control circuit 110. The control circuit 110 provides the erasing voltage VERA, the word line voltage VWL, the first selecting signal SS1 and the second selecting signal SS2 during the erasing operation.

Figure 4:
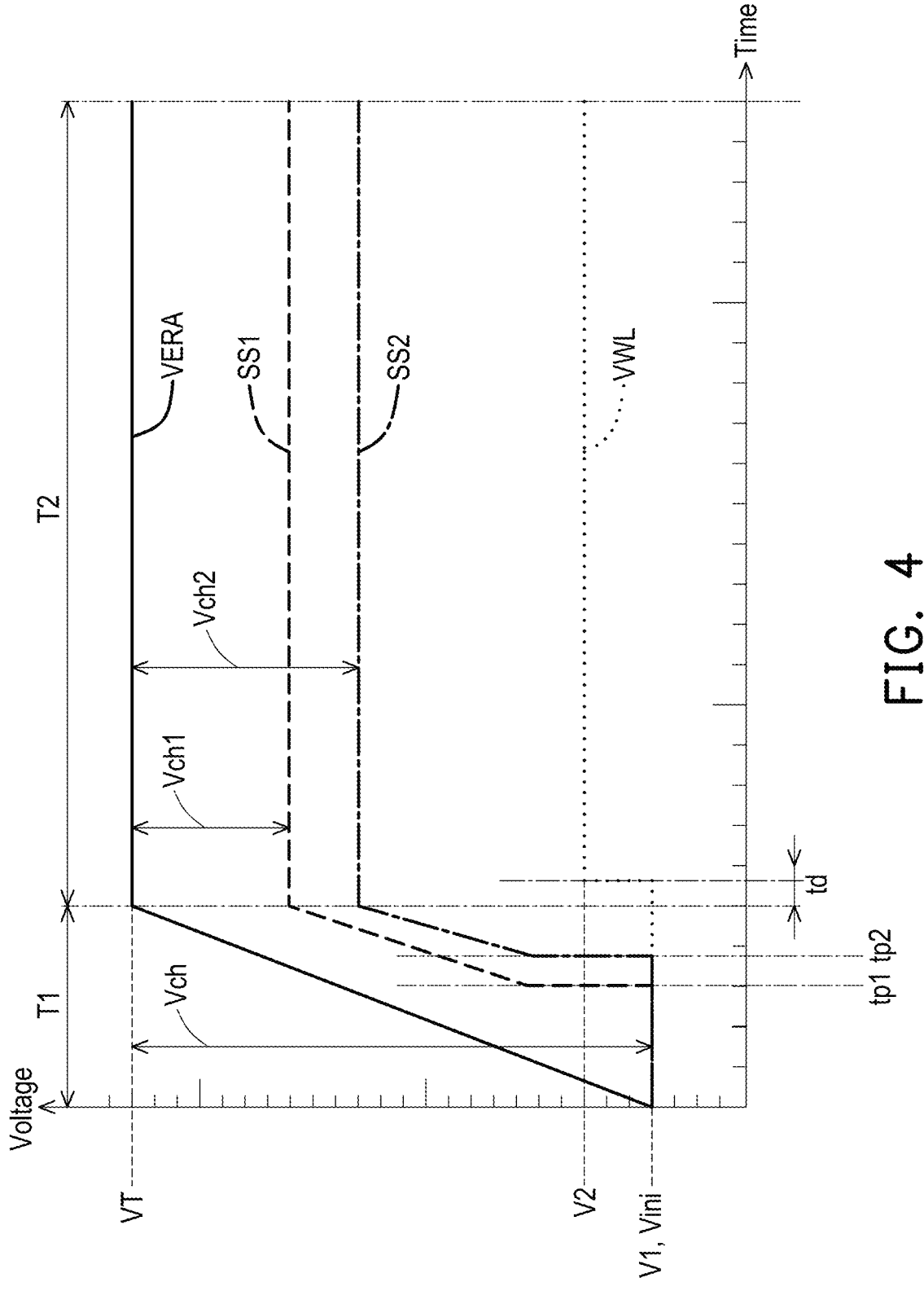
FIG. 4 illustrates a waveform diagram according to an embodiment of the disclosure.
Figure 5:
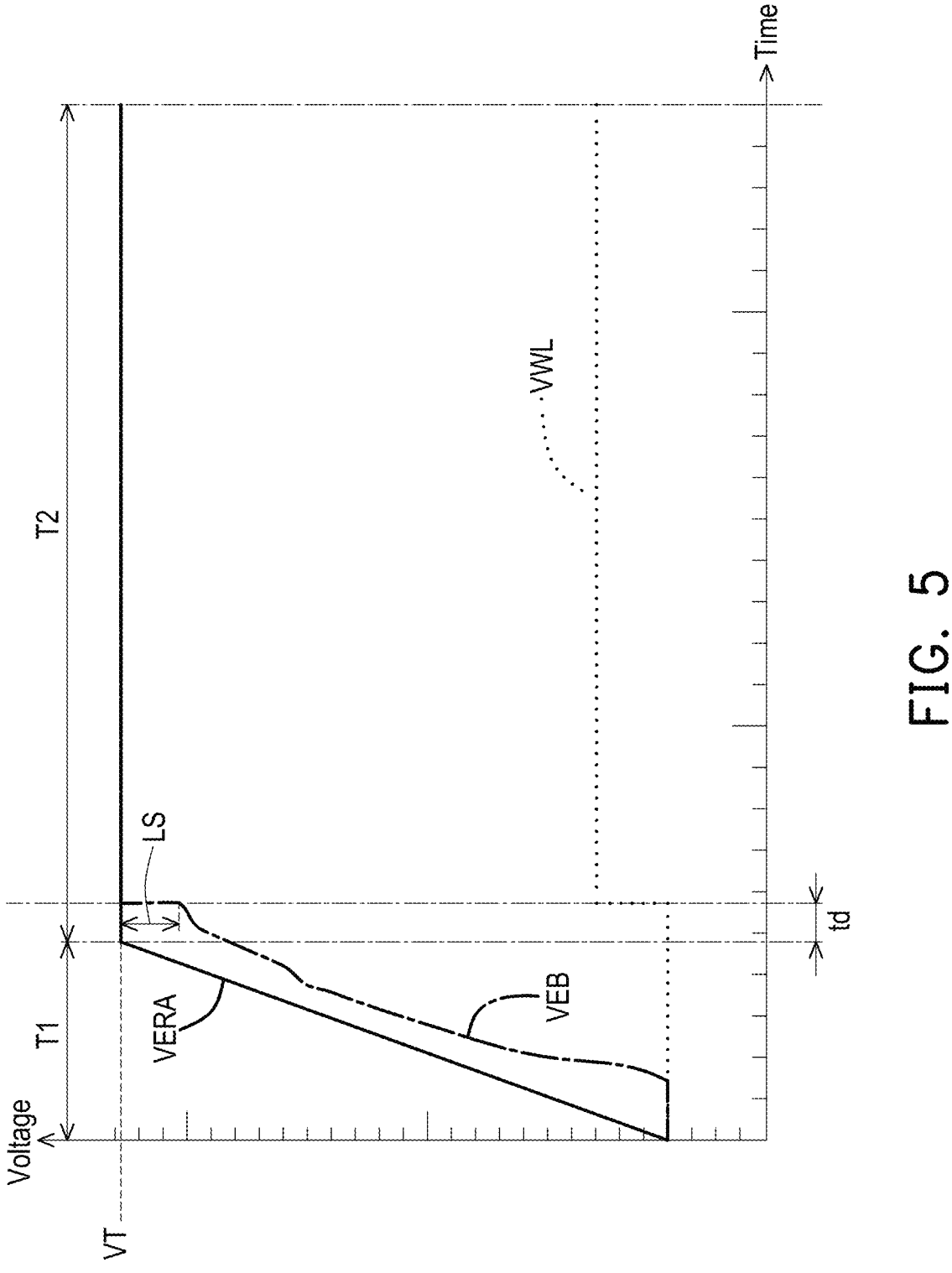
FIG. 5 illustrates a waveform diagram of an erasing voltage, a channel potential and a word line voltage according to an embodiment of the disclosure.

Please refer to FIG. 1, FIG. 4 and FIG. 5, FIG. 4 illustrates a waveform diagram according to an embodiment of the disclosure. FIG. 5 illustrates a waveform diagram of an erasing voltage, a channel potential and a word line voltage according to an embodiment of the disclosure. In the embodiment, in the first period T1 of the erasing operation, the voltage value of the erasing voltage VERA is raised to the target voltage value VT. For example, in the first period T1, the voltage value of the erasing voltage VERA is ramped gradually from an initial voltage value Vini to the target voltage value VT. In the first period T1, the voltage value of the word line voltage VWL is the first voltage value V1. The first voltage value V1 is equal to the initial voltage value Vini, but the disclosure is not limited thereto. When the voltage value of the erasing voltage VERA reaches to the target voltage value VT, the first period T1 finishes, and the second period T2 begins.

In the second period T2 after the first period T1 of the erasing operation, the voltage value of the erasing voltage VERA is the target voltage value VT. The voltage value of the word line voltage VWL is raised from the first voltage value V1 to the second voltage value V2. In the embodiment, the voltage value of the word line voltage VWL is raised to the second voltage value V2 from the first voltage value V1 after the default time length td.

In the embodiment, the difference voltage Vch between the target voltage value VT and the first voltage value V1 may be decided based on difference design or process of the memory strings STR1 to STRn. The erase biases loss LS is changed based on the design or the process. in order to decrease the erase biases loss LS, the difference voltage Vch is in the range larger than 20 and less than 26 volts. The difference voltage of the first voltage value V1 minus the second voltage value V2 is designed to be in a range from zero to −6 volts. For example, the initial voltage value Vini and the first voltage value V1 are 0 volt. The target voltage value VT is 26 volts. The second voltage value V2 is higher than first voltage value V1 and lower than or equal to 6 volts. More precisely, the difference voltage of the first voltage value V1 minus the second voltage value V2 is designed to be in a range from −3 to −4 volts. Therefore, the second voltage value V2 is in the range from 3 to 4 volts.

In the embodiment, the first selecting signal SS1 begins to be floated on the first time point tp1. The voltage value of the first selecting signal SS1 starts rising roughly as the erasing voltage VERA rises on the first time point tp1. Therefore, after the first time point tp1, the difference voltage Vch1 between the voltage value of the first selecting signal SS1 is fixed. The second selecting signal SS2 begins to be floated on the second time point tp2. The voltage value of the second selecting signal SS2 starts rising roughly as the erasing voltage VERA rises on the second time point tp2. Therefore, after the second time point tp2, the difference voltage Vch2 between the voltage value of the erasing voltage VERA and the voltage value of the second selecting signal SS2 is fixed. Besides, the difference voltage Vch1 is associated with a voltage withstand capability of the string select transistor SST. The difference voltage Vch2 is associated with a voltage withstand capability of the ground select transistor GST. For example, in the second period T2, the target voltage value VT is 23 volts. The voltage value of the first selecting signal SS1 is 16 volts. The voltage value of the second selecting signal SS2 is 7 volts. Therefore, the difference voltage Vch1 is 13 volts. The difference voltage Vch2 is 10 volts.

Please refer to FIG. 1 and FIG. 6, FIG. 6 illustrates a flow chart of an operating method according to an embodiment of the disclosure. In the embodiment, the operating method S100 is applicable to operate the memory device 100. The operating method S100 includes steps S110 to S130. In the step S110, during the erasing operation, an erasing voltage VERA is applied to at least one of the common source line CSL and the bit lines BL<1> to BL<n>. During an erasing operation, the word line voltage VWL is applied to the memory cells of the memory strings STR1 to STRn.

In the step S120, in the first period T1 of the erasing operation, the voltage value of the erasing voltage VERA is raised to the target voltage value VT. For example, in the first period T1, the voltage value of the erasing voltage VERA is ramped gradually to the target voltage value VT. In the first period T1, the voltage value of the word line voltage VWL is the first voltage value V1.

In the step S130, in the second period T2 after the first period T1 of the erasing operation, the voltage value of the erasing voltage VERA is the target voltage value VT, and the voltage value of the word line voltage VWL is raised from the first voltage value V1 to the second voltage value V2.

The detail operations of the steps S110 to S130 have been clearly explained in the embodiments of FIG. 1 to FIG. 5, so it will not be repeated here.

In view of the foregoing, in the first period of the erasing operation, the voltage value of the erasing voltage is raised, and the voltage value of the word line voltage is the first voltage value. In the second period after the first period of the erasing operation, the voltage value of the erasing voltage is the target voltage value, and the voltage value of the word line voltage is raised from the first voltage value to the second voltage value. In the second period, the raised word line voltage raises the channel potential in the channel in the at least one memory string. Therefore, the channel potential could be compensated in the second period. The erasing operation could be enhanced. In this way, an erase biases loss between the erasing voltage and the channel potential could be decreased. Thus, the disclosure provides the stable and enhanced GIDL assisted erasing operation.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory device, comprising:
a common source line;
at least one bit line; and
at least one memory string, coupled to the common source line and the at least one bit line respectively,
during an erasing operation, an erasing voltage is applied to at least one of the common source line and the at least one bit line, and a word line voltage is applied to a plurality of memory cells of the at least one memory string, in a first period of the erasing operation, a voltage value of the erasing voltage is raised to a target voltage value, and a voltage value of the word line voltage is a first voltage value, and in a second period after the first period of the erasing operation, the voltage value of the erasing voltage is the target voltage value, and the voltage value of the word line voltage is raised from the first voltage value to a second voltage value, wherein a difference voltage of the first voltage value minus the second voltage value is in a range from zero to −6 volts.

2. The memory device of claim 1, wherein a difference voltage between the target voltage value and the first voltage value is in a range larger than 20 and less than 26 volts.

3. The memory device of claim 1, wherein when entering in the second period of the erasing operation, and the voltage value of the word line voltage is raised from the first voltage value to the second voltage value after a default time length.

4. The memory device of claim 3, wherein the default time length is larger than zero and less than 400 micro seconds.

5. The memory device of claim 1, wherein in the first period of the erasing operation, the voltage value of the word line voltage is decreased from an initial voltage value to the first voltage value.

6. The memory device of claim 1, wherein the difference voltage of the first voltage value minus the second voltage value is in a range from −3 to −4 volts.

7. The memory device of claim 1, wherein in the first period of the erasing operation, the first voltage value is equal to an initial voltage value.

8. The memory device of claim 1, wherein the first period of the erasing operation further comprises:
a first selecting signal applied to a string select transistor begins to be floated on a first time point, wherein the string select transistor is coupled between a first edge memory cell among the plurality of memory cells of the at least one memory string and the at least one bit line; and
a second selecting signal applied to a ground select transistor begins to be floated on a second time point later than the first time point, wherein the ground select transistor is coupled between a second edge memory cell among the plurality of memory cells of the at least one memory string and the common source line.

9. The memory device of claim 8, wherein in the second period of the erasing operation, a voltage value of the first selecting signal is higher than a voltage value of the second selecting signal.

10. The memory device of claim 1, wherein:
the common source line extends along a first direction,
the at least one bit line extends along a second direction and arrange along the first direction,
the plurality of memory cells of the at least one memory string arrange along a third direction, and
the first direction, the second direction and the third direction are different from each other.

11. An operating method for a memory device, wherein the memory device comprises a common source line, at least one bit line and at least one memory string coupled to the common source line and the at least one bit line respectively, wherein the operating method comprises:
during an erasing operation, applying an erasing voltage to at least one of the common source line and the at least one bit line during the erasing operation, and applying a word line voltage to a plurality of memory cells of the at least one memory string;

in a first period of the erasing operation, raising a voltage value of the erasing voltage to a target voltage value and applying a voltage value of the word line voltage at a first voltage value, and in a second period after the first period of the erasing operation, applying the voltage value of the erasing voltage at the target voltage value and raising the voltage value of the word line voltage from the first voltage value to a second voltage value, wherein a difference voltage of the first voltage value minus the second voltage value is in a range from zero to −6 volts.

12. The operating method of claim 11, wherein a difference voltage between the target voltage value and the first voltage value is in a range larger than 20 and less than 26 volts.

13. The operating method of claim 11, wherein the step of raising the voltage value of the word line voltage from the first voltage value to a second voltage value comprises:

raising the voltage value of the word line voltage from the first voltage value to the second voltage value after a default time length.

14. The operating method of claim 13, wherein the default time length is larger than zero and less than 400 micro seconds.

15. The operating method of claim 11, further comprising:

decreasing the voltage value of the word line voltage from an initial voltage value to the first voltage value in the first period of the erasing operation.

16. The operating method of claim 11, wherein the difference voltage of the first voltage value minus the second voltage value is in a range from −3 to −4 volts.

17. The operating method of claim 11, wherein in the first period of the erasing operation, the first voltage value is equal to an initial voltage value.

18. The operating method of claim 11, wherein the first period of the erasing operation further comprising:

beginning to float a first selecting signal applied to a string select transistor on a first time point, wherein the string select transistor is coupled between a first edge memory cell among the plurality of memory cells of the at least one memory string and the at least one bit line; and beginning to float a second selecting signal applied to a ground select transistor on a second time point later than the first time point, wherein the ground select transistor is coupled between a second edge memory cell among the plurality of memory cells of the at least one memory string and the common source line.

19. An operating method for a memory device, wherein the memory device comprises a common source line, at least one bit line and at least one memory string coupled to the common source line and the at least one bit line respectively, wherein the operating method comprises:

during an erasing operation, applying an erasing voltage to at least one of the common source line and the at least one bit line during the erasing operation, and applying a word line voltage to a plurality of memory cells of the at least one memory string;

in a first period of the erasing operation, raising a voltage value of the erasing voltage to a target voltage value and applying a voltage value of the word line voltage at a first voltage value, and in a second period after the first period of the erasing operation, applying the voltage value of the erasing voltage at the target voltage value and raising the voltage value of the word line voltage from the first voltage value to a second voltage value, wherein a difference voltage of the first voltage value minus the second voltage value is in a range from −3 to −4 volts.

* * * * *